United States Patent [19]

Cho et al.

[11] Patent Number: 5,726,939
[45] Date of Patent: Mar. 10, 1998

[54] SEMICONDUCTOR MEMORY DEVICE HAVING FAST WRITING CIRCUIT FOR TEST THEREOF

[75] Inventors: Soo-In Cho; Jung-Hwa Lee, both of Seoul, Rep. of Korea

[73] Assignee: Samsung Electronics Co., Ltd., Suwon, Rep. of Korea

[21] Appl. No.: 668,952

[22] Filed: Jun. 24, 1996

[30] Foreign Application Priority Data

Jun. 23, 1995 [KR] Rep. of Korea ............... 17107/1995

[51] Int. Cl.⁶ ............................................. G11C 13/00
[52] U.S. Cl. ................................. 365/201; 365/189.04
[58] Field of Search ........................................ 365/201

[56] References Cited

U.S. PATENT DOCUMENTS 5,140,553  8/1992  Choi et al. .................... 365/238.5
5,208,778  5/1993  Kumanoya et al. ............... 365/201
5,253,211  10/1993  Suzuki ........................... 365/201
5,276,648  1/1994  Yanagisawa et al. ............. 365/177

Primary Examiner—David C. Nelms
Assistant Examiner—Michael T. Tran
Attorney, Agent, or Firm—Marger, Johnson, McCollom & Stolowitz, P.C.

[57] ABSTRACT

The time required for testing high-density semiconductor memory devices is reduced by circuits and methodology for rapidly writing test data bits into the memory array. A common word line enable signal is arranged to turn on all of the word lines in the array simultaneously. Test data bits are applied to the array by gating them onto the I/O lines so that separate test bit lines are not required. A fast test enable signal gates the test bits onto the I/O lines in all columns of the array simultaneously, so that all of the memory cells receive test bits at one time. The new circuitry has the further advantages of reduced area and capacitance, the latter further contributing to reducing the test data write time.

11 Claims, 2 Drawing Sheets

SEMICONDUCTOR MEMORY DEVICE HAVING FAST WRITING CIRCUIT FOR TEST THEREOF

BACKGROUND OF THE INVENTION

1. Field of the Invention

The present invention relates to semiconductor memory device, and more particularly, to methods and circuits used for writing test bits into memory cells at high speed during testing of semiconductor memory devices.

The present application is based on Korean Application No. 17107/1995 which is incorporated herein by reference for all purposes.

2. Description of the Related Art

In semiconductor memories, due to increasing density thereof, the manufacturing process has become more complicated. Falling production yield due to defects of the memory cells has become a serious problem. To detect such failures, semiconductor manufacturers generally perform reading and writing of test bits into and out of each memory cell on a completed chip. A writing circuit used for such a purpose is required to perform a write operation at high speed in order to minimize the testing time, especially with respect to high density semiconductor memory devices. To illustrate, if it takes a full millisecond to read, write and compare one bit at a time, a 64 Mb chip would take 18.64 hours to test! That would not be practical.

FIG. 1 illustrates a conventional writing circuit and memory cell array. Each pair of bit lines BL and BLB are connected to a corresponding pair of input/output lines IO and IOB through a sense amplifier SA and column gates G1 and G2 as shown. Each pair of column gates G1 and G2 are provided with corresponding column select signals generated by column decoders (not shown). A pair of switching transistors, e.g. N2 and N3 whose gates are commonly connected to a fast write signal φFW are connected between each pair of test bit lines TBL and TBLB (provided by the writing circuit 1) and the corresponding pair of bit lines BL and BLB. For each memory cell, an equalizing transistor, e.g. N1 is connected across the pair of test bit lines TBL and TBLB. All of the equalizing transistors gates are connected in common to an equalizing control signal φEQ. Each memory cell is connected between the corresponding bit line BL and the corresponding word line WL.

In the writing circuit 1, an equalizing transistor N4 whose gate is connected to the equalizing signal is connected between the pair of test bit lines TBL and TBLB. NMOS transistors N9 and N10 for application of an equalizing voltage, are respectively connected between test bit lines TBLB and TBL and an equalizing voltage source VBL, and have their gates connected in common to a control signal E. An NMOS transistor N5, which is connected between supply voltage Vcc and test bit line TBLB, is connected to receive a data signal A at its gate. Another NMOS transistor N7, which is connected between the test bit line TBLB and ground potential Vss, is connected to receive a data signal C at its gate. In addition, an NMOS transistor N6, which is connected between supply voltage Vcc and the test bit line TBL, is connected to receive a data signal B at its gate, and an NMOS transistor N8, which is connected between the test bit line TBL and ground potential Vss, is connected to receive a data signal D at its gate.

During a write operation, the pair of input/output lines IO and IOB are isolated from the sense amplifiers SA by the gate transistors, e.g. G1, G2. When the fast writing signal is enabled to a logic "high" level, the pairs of switching transistors N2 and N3 are turned on, thereby coupling the pair of test bit lines TBL and TBLB to all of the bit line pairs BL, BLB, respectively. A data bit is written into each memory cell MC connected to a selected word line WL. The data bit is determined according to the logic states of each of the data signals A, B, C and D. As each word line is sequentially enabled, the test bits are written to the corresponding memory cells.

On the other hand, in a normal operating mode of the memory, the fast writing signal is disabled to a logic "low" level, so that the pairs of switching transistors N2 ad N3 are all turned off. Consequently, the test bit lines are disconnected from the bit lines. The bit line pairs are connected instead to the input/output line pairs through the sense amps and column gates G1 and G2.

However, the fast writing circuit as shown in FIG. 1 requires a node area 2, to which the pair of test bit lines and a plurality of bit line pairs are connected. In node area 2, a large bit line capacitance occurs due to the common connections among individual bit lines. This bit line capacitance is exacerbated with increased density of the semiconductor memory device, and slows the test writing time. Furthermore, in the configuration as shown in FIG. 1, the test write cycle is repeated for each word line. This circuit is therefore too slow for testing high density integrated semiconductor memory devices.

SUMMARY OF THE INVENTION

Accordingly, it is an object of the present invention to provide a circuit capable of reducing the writing time for testing a semiconductor memory device. According to one aspect of the invention, capacitance associated with test bit lines is reduced by coupling test bit write circuit directly to the memory I/O lines, whereby separate test bit lines are substantially eliminated.

According to another aspect of the invention, test bit write time is reduced by simultaneously writing test bits to all the bits of a memory array at one time. According to a further aspect of the invention, testing memory devices is achieved in part by writing test bits to the memory cells through the sense amps, whereas in prior art separate test bit lines are connected directly to the memory cells, and the sense amps are disconnected from the I/O lines during the test write operation.

To achieve this and other objects according to the principles of the present invention, a semiconductor memory device having a plurality of word lines and bit lines and a pair of memory cells includes a plurality of switching transistors (TL) which are connected to respective word lines and controlled by a single, common word line enable signal (φBIE), so as to simultaneously enable all of the word lines for a test write operation. Isolation transistors (TI) controllably isolate or connect the memory cell bit lines to the corresponding sense amplifiers. The isolation transistors are controlled by a common isolation control signal (φISO).

A memory device according to the invention further includes a plurality of transmission transistors (TC), each transmission transistor arranged for controllably connecting a respective sense amp line and a corresponding one of the input/output lines. In addition, a plurality of logic gates (which in common receive a fast writing signal and respectively receive corresponding column selection signals) are provided to control the transmission transistors, so as to gate all of the sense amp lines onto the I/O lines when the fast write signal φFWE is asserted. A new write circuit selectively drives selected data onto the I/O lines to provide test bits in response to data signals.

BRIEF DESCRIPTION OF THE DRAWINGS

A more complete appreciation of this invention, and many of the attendant advantages thereof, will become apparent as the same becomes better understood by reference to the following detailed description, considered in conjunction with the accompanying drawings, in which like reference symbols indicate the same or similar elements, and wherein.

DETAILED DESCRIPTION OF THE PREFERRED EMBODIMENT

Figure 2:
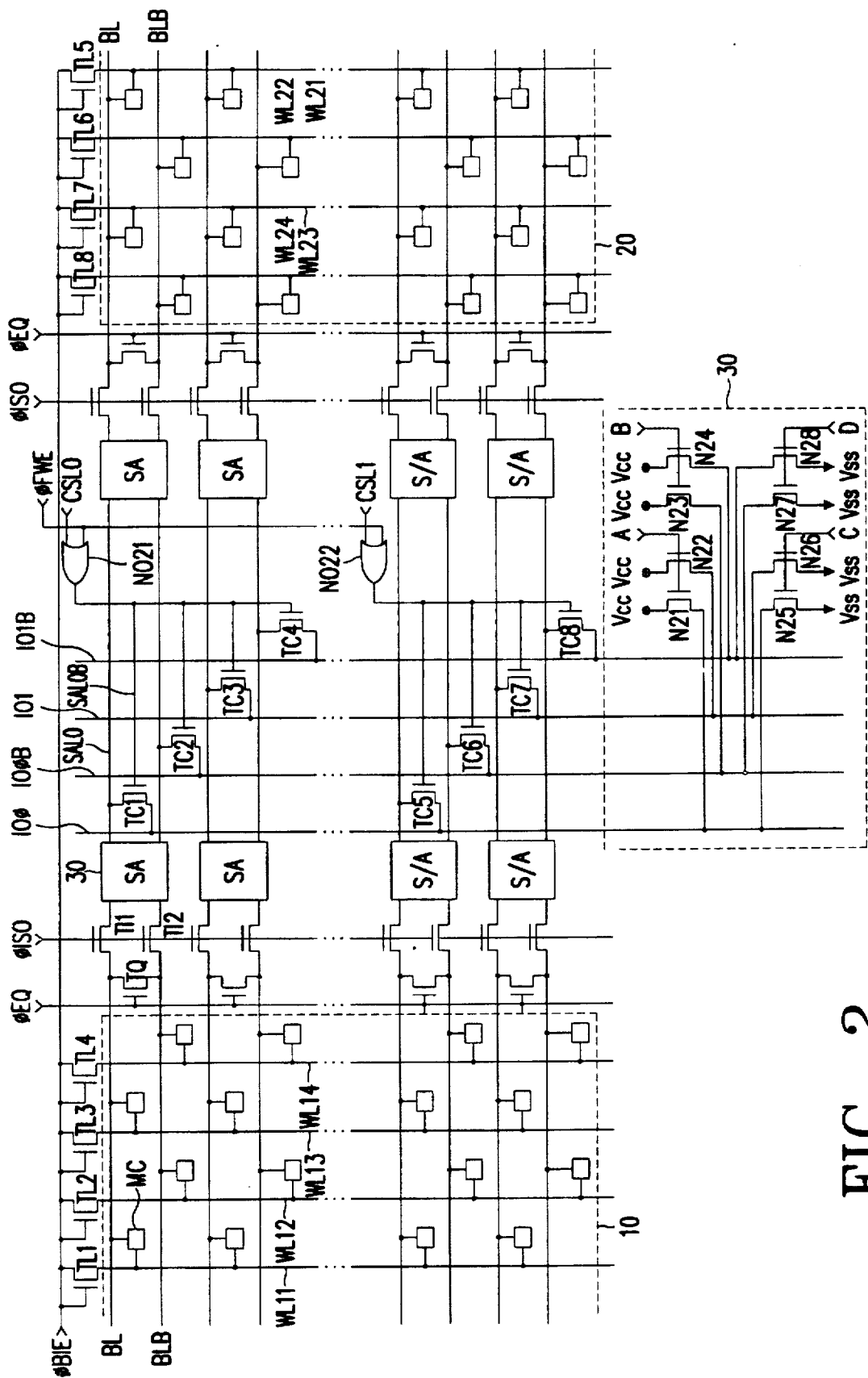
FIG. 2 is a circuit diagram illustrating a writing circuit and associated semiconductor memory cell array in accordance with the present invention.

Referring to FIG. 2, which illustrates a connection relationship between a writing circuit in accordance with the present invention and a memory cell array, all the word lines WL of the memory cell array are simultaneously selected or unselected through switching transistors TL. More specifically, word lines WL are connected to the sources of switching transistors TL which, in turn, are connected to a common word line enable signal φBIE at their gates and drains. For example, word lines WL11–WL 14 of subarray 10 are connected to switching transistors TL1–TL4, respectively, while word lines WL21–WL 24 of subarray 20 are connected to switching transistors TL5–TL8, respectively. Accordingly, assertion of φBIE selects all of the word lines at once.

A plurality of bit line pairs BL and BLB are controllably connected to respective sense amplifiers through corresponding isolation transistor pairs, e.g. TI1 and TI2. An isolation signal φISO controls the isolation transistor pairs TI1 and TI2 gates in common. Note the memory array is symmetrically arranged with subarray 10 on the left of the drawing and subarray 20 on the right of the drawing. The isolation signal φISO is supplied to both subarrays. In each subarray, an equalizing transistor TQ whose gate is connected to a common equalizing signal φEQ is connected across each pair of bit lines BL and BLB.

Two pairs of input/output lines IO0 and IO0B and IO1 and IO1B are arranged in a row direction, normal to sense amplifier line pairs SALO and SALOB, so as to transmit test bits provided from the writing circuit 30, as well as data input and output during normal operating mode, to and from the memory cells (MC). Sense amplifier line pairs SAL0, SAL0B to SALn,SALnB are connected to corresponding input/output line pairs through corresponding transmission transistors TC. The transmission transistor gates of each column are connected in common to the output of a respective OR gates. For example, the gates of TC1–TC4 are connected in common to the output of OR gate NO21 for column 0. The OR gates, e.g. NO21 and NO22, receive the fast writing signal φFWE in common, and each OR gate receives a corresponding one of the column selection signals, e.g. CSL0 and CSL1. In other words, each transmission transistor TC is connected between a respective one of the input/output lines and a corresponding sense amplifier line, under control of an output of one of OR gates NO21 and NO22. The sense amp lines are common to the left and right subarray sense amps. The fast write signal φFWE thus enables all of the transmission transistors at once, while allowing normal column select using the CSL signals during normal operation of the device.

The writing circuit 30 is composed of a plurality of NMOS transistor pairs N21 and N22, N23 and N24, N25 and N26, and N27 and N28. The pair of NMOS transistors N21 and N22 whose gates are jointly connected to the data signal A, are respectively connected between a supply voltage source Vcc and input/output line IO0, and between supply voltage Vcc and input/output line IO1. The pair of NMOS transistors N23 and N24, whose gates are jointly connected to receive the data signal B, are respectively connected between a supply voltage source Vcc and input/output line IO0B, and between supply voltage Vcc and input/output line IO1B.

Figure 1:
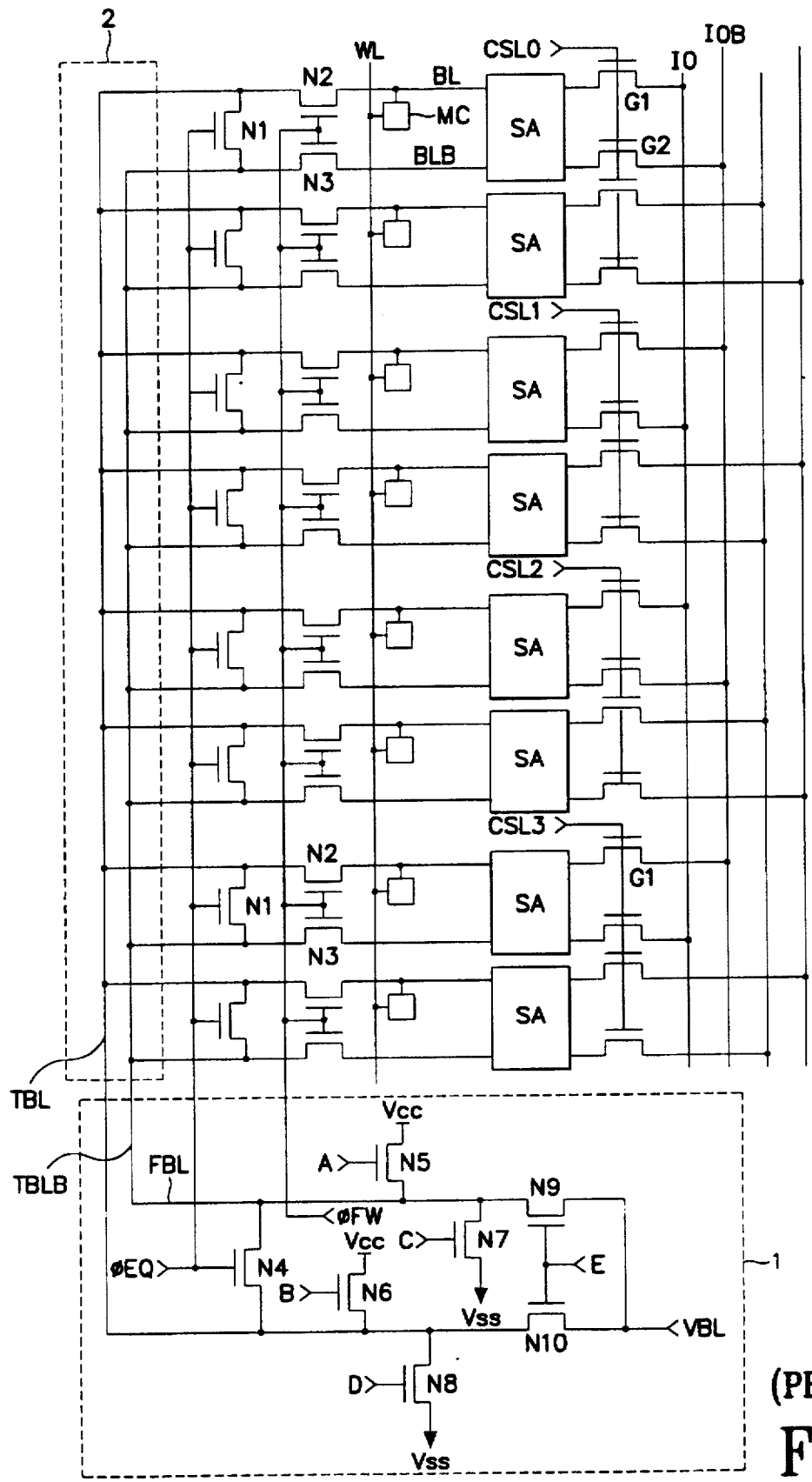
FIG. 1 is a circuit diagram illustrating a prior art writing circuit and associated semiconductor memory cell array.

Similarly, the pair of NMOS transistors N25 and N26, whose gates are jointly connected to receive the data signal C, are respectively connected between ground potential Vss and input/output line IO0 and between ground potential Vss and input/output line IO1. And finally, the pair of NMOS transistors N27 and N28, whose gates are jointly connected to receive the data signal D, are respectively connected between ground potential Vss and input/output line IO0B and between ground potential Vss and input/output line IO1B. The writing circuit 30 thus drives the I/O lines in response to the A B C and D data signals. Accordingly, it can be observed that the separate node area 2 as shown in FIG. 1 is not required in this arrangement of the writing circuit and input/output lines as described previously.

In a writing operation mode, when the word line enable signal φBIE is asserted, all the word lines are simultaneously driven. And when the fast writing signal φFWE and isolation signal φISO are enabled, all of the bit lines and corresponding input/output lines are connected. The φBIE common word line enable signal is provided with a high voltage level greater than the supply voltage so as to ensure an accurate writing operation to all memory cells. In the fast test write operation, the same data bit is written in all the memory cells connected to input/output line pairs by transmitting test bits in accordance with the logic states of each of data signals A, B, C and D. A desired test data pattern can be made by selectively designating logic states of data signals A, B, C and D as a level of supply voltage Vcc or ground potential Vss.

In the normal operation mode, the word line enable signal and fast writing signal are disabled to the logic "low" level, all data signals A, B, C and D go to the logic "low" level (the ground potential level), and data reading/writing operations for the memory cells are performed by the word line selected by an address and column selection signal.

As evident from the foregoing, according to the present invention, data writing operations for all the memory cells which are connected between word lines and bit line pairs can be simultaneously performed. This feature is advantageous in that the test data writing time is reduced. Moreover, the separate "node area" and test bit wiring for transmitting test bits to the memory cell array are not required. Accordingly, chip area can be reduced and delay of the test signal transmission due to capacitance can be avoided as well.

Therefore, it should be understood that the present invention is not limited to the particular embodiment disclosed herein as the best mode contemplated for carrying out the present invention, but rather that the present invention is not limited to the specific embodiment described in this specification except as defined in the appended claims.

What is claimed is:

1. A semiconductor memory device having a plurality of word lines and bit line pairs and a plurality of memory cells, comprising:

a plurality of switching transistors, each of the switching transistors being connected to a respective one of said word lines and all of the switching transistors being connected to receive a single, common word line enable signal, so as to permit simultaneously enabling all of said word lines for a test operation by asserting the common word line enable signal;

an input/output line pair;

a plurality of transmission transistors arranged for controllably coupling each column of the array to the input/output line pair in response to a corresponding column select signal;

a logic gate for each column of the array, each logic gate having a first input connected to receive the corresponding column select signal and having a second input connected to receive a common test enable signal, the outputs of the logic gates being connected to the transmission transistor control gates so as to couple all of the columns of the array to the I/O line pair when the common test enable signal is asserted and selectively couple each individual column of the array to the I/O line pair responsive to the corresponding column select signal when the common test enable signal is not asserted; and a fast write circuit connected to said input/output lines for transmitting selected test write data to the memory cells.

2. A semiconductor memory device according to claim 1 wherein the fast write circuit includes, for each input/output line, a pull-up means for controllably coupling the corresponding input/output line to a supply voltage source Vcc in response to a first data signal and pull-down means for controllably coupling the corresponding input/output line to a ground potential in response to a second data signal.

3. A semiconductor memory device according to claim 2 wherein the pull-up means and the pull-down means each comprise a transistor.

4. A semiconductor memory device according to claim 1 wherein said switching transistors include MOS transistors having drain and gate terminals connected in common to receive the common word line enable signal and have source terminals connected to the word lines, respectively.

5. A semiconductor memory device according to claim 4 further comprising means for providing a high voltage greater than the supply voltage Vcc as the common word line enable signal for simultaneously asserting all of the word lines in the memory array.

6. A semiconductor memory device according to claim 1 wherein said bit line pairs are respectively connected to corresponding sense amps through respective pairs of isolation transistors and further comprising means for turning on said isolation transistors so as to simultaneously connect all of the bit line pairs in the array to the corresponding sense amps in response to a common isolation control signal during a test write mode of operation.

7. A semiconductor memory device according to claim 1 wherein the logic gates comprise logic OR gates, each OR gate having one input connected to receive the fast write enable signal and another input connected to receive a respective one of the column select signals so as to gate the fast write signal to the transmission transistors during a test operation, and gate the column select signals to the transmission transistors during normal operation mode of the memory device.

8. A method of writing test data into a semiconductor memory device having an array of memory cells comprising the steps of:

simultaneously enabling all of the word lines;

simultaneously selecting all of the columns of the array thereby coupling all of the columns to I/O lines; and writing selected test data bits onto the I/O lines thereby simultaneously writing the test data bits to all of the memory cells.

9. A method of testing a semiconductor memory device according to claim 8 wherein said writing step includes applying the test data bits directly to the I/O lines and coupling the I/O lines through sense amps to the corresponding rows of the array of memory cells.

10. A method according to claim 8 wherein said selecting all of the columns of the array includes gating the I/O lines to the sense amps in all of the columns in response to a common fast write enable signal.

11. A method of testing a semiconductor memory device according to claim 9 further comprising, for each column of the array, providing an OR logic gate and gating the I/O lines to the sense amps in response to a common fast write enable signal logic ORed together with the corresponding column select signal.

* * * * *